(12) United States Patent
Kim et al.

(10) Patent No.: US 9,331,273 B2
(45) Date of Patent: May 3, 2016

(54) MEMORY CELL ARRAY AND VARIABLE RESISTIVE MEMORY DEVICE INCLUDING THE SAME

(71) Applicant: SK hynix Inc., Gyeonggi-do (KR)

(72) Inventors: Sung Cheoul Kim, Gyeonggi-do (KR); Kang Sik Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/328,382

(22) Filed: Jul. 10, 2014

(65) Prior Publication Data

US 2014/0319451 A1 Oct. 30, 2014

Related U.S. Application Data

(63) Continuation-in-part of application No. 13/601,778, filed on Aug. 31, 2012, now Pat. No. 8,785,903.

(30) Foreign Application Priority Data

May 24, 2012 (KR) .......................... 10-2012-0055455

(51) Int. Cl.
| | | |
|---|---|---|
| H01L 29/02 | (2006.01) | |
| H01L 29/76 | (2006.01) | |
| H01L 29/788 | (2006.01) | |
| H01L 21/8239 | (2006.01) | |
| H01L 45/00 | (2006.01) | |
| H01L 27/24 | (2006.01) | |

(52) U.S. Cl.
CPC ........ *H01L 45/1233* (2013.01); *H01L 27/2436* (2013.01); *H01L 27/2463* (2013.01); *H01L 45/04* (2013.01); *H01L 45/126* (2013.01)

(58) Field of Classification Search
CPC .................. H01L 27/10876; H01L 27/10885; H01L 2924/0002; H01L 27/115; H01L 27/10891; H01L 27/10852; H01L 2924/00; H01L 45/1683; H01L 27/10814; H01L 27/11568; H01L 27/249; H01L 45/06; H01L 45/1226
USPC .......... 257/2–5, 296, 328, 329, 401, E29.118, 257/E27.103, E45.002; 438/900
See application file for complete search history.

(56) References Cited

U.S. PATENT DOCUMENTS

| | | | | |
|---|---|---|---|---|
| 2002/0028541 | A1* | 3/2002 | Lee | ..................... G11C 16/3427 438/149 |
| 2006/0138467 | A1* | 6/2006 | Lung | ....................... H01L 45/06 257/209 |
| 2010/0295009 | A1* | 11/2010 | Lung | .................... H01L 45/1683 257/2 |
| 2013/0099305 | A1* | 4/2013 | Kim | ...................... H01L 27/2454 257/329 |
| 2013/0313511 | A1* | 11/2013 | Kim | ....................... H01L 27/228 257/5 |

* cited by examiner

*Primary Examiner* — Kimberly Rizkallah
*Assistant Examiner* — Brian Turner
(74) *Attorney, Agent, or Firm* — IP & T Group LLP

(57) ABSTRACT

A memory cell array includes a semiconductor substrate, a first word line formed on the semiconductor substrate, a second word line formed on the semiconductor substrate and extending substantially parallel to the first word line, a first inter-pattern insulating layer interposed between the first and second word lines, first active pillars formed within the first word line and arranged along the first word line at a first interval, and second active pillars formed within the second word lines, and arranged along the second word line to face the first active pillars, respectively, with the first inter-pattern insulating layer interposed therebetween.

20 Claims, 5 Drawing Sheets

MEMORY CELL ARRAY AND VARIABLE RESISTIVE MEMORY DEVICE INCLUDING THE SAME

CROSS-REFERENCES TO RELATED APPLICATION

The application is a continuation-in-part of U.S. patent application Ser. No. 13/601,778, filed on Aug. 31, 2012, which claim priority of Korean Patent Application No. 10-2012-0055455, filed on May 24, 2012. The disclosure of each the foregoing applications is incorporated herein by reference in its entirety.

BACKGROUND OF THE INVENTION

1. Technical Field

The inventive concept relates to a semiconductor device, and more particularly, to a variable resistive memory device including a memory cell array.

2. Related Art

Portable digital apparatuses have been spread day by day. Ultra-high integration, ultra-high speed, and ultra-low power consumption are required to memory devices embedded in the portable digital apparatuses for processing large-capacity data with higher speed, although the memory devices have a limited size.

To meet the demands, vertical memory devices have been actively researched. Three-dimensional (3D) vertical gate structures have been applied to resistive memory devices which are considered as one of next-generation memory devices.

The resistive memory devices are configured to select a cell through an access device and change a resistance of a data storage material of the selected cell, which is electrically coupled to the access device, to store data. As the resistive memory devices, there are phase-change memory devices, resistive memory devices, magnetoresistive memory devices, and the like.

The resistive memory device may employ a diode or a transistor as the access device. In particular, the thresh voltage of the transistor may be lowered as compared with the diode. Thus, the transistor can reduce an operation voltage. As the transistor can be fabricated in a vertical structure, the transistor has received attention again as the access device of the resistive memory device.

That is, since a voltage of 1.1 V or more has to be applied to the diode, there is a limit to lower the operation voltage. Further, when the diode is formed on the word line, resistance of the word line is changed according to positions of cells. Thus, a word line bouncing issue occurs.

Since the transistor generally has a horizontal structure in the related art, there is a limit to increase an integration degree of device. However, unlike a horizontal structure, the vertical transistor may sufficiently ensure current drivability in the limited channel area.

FIG. 1 is a layout diagram schematically illustrating a general 3D variable resistive memory device.

Referring to FIG. 1, a plurality of active pillars 20 are regularly arranged on a semiconductor substrate in a row and column directions. The active pillars 20 are configured to have a line width of 1F (F is a minimum feature size) in width and length. The active pillars 20 are arranged to have a distance of 0.5F in a column direction and a distance of 1.5F in a row direction. A word line 30 is arranged on active pillars 20 positioned in the same column. The word line 30 may be arranged to entirely surround the active pillar 20 to have a line width of 2F. Further, the word line 30 may be spaced by an interval of 0.5F to be insulated from an adjacent word line 30.

As shown in FIGS. 2 and 3, the word line 30 is arranged between the active pillars 20 in the column direction and the word lines 30 are spaced from each other by a distance S in the column direction. Here, the reference numeral 10 denotes a semiconductor substrate, and the reference numeral 15 denotes a common source electrode.

In the related art, the active pillars 20 are arranged to be surrounded by the word line 30. Thus, the distance between the active pillars 20 may be reduced in an extension direction of the word line. However, there may be still a limit to reduce the distance between the active pillars in the row direction.

SUMMARY

According to an embodiment, there is provided a memory cell array. The memory cell array may include a semiconductor substrate, a first word line formed on the semiconductor substrate, a second word line formed on the semiconductor substrate, and extending substantially parallel to the first word line, a first inter-pattern insulating layer interposed between the first and second word lines, first active pillars formed within the first word line, and arranged along the first word line at a first interval, and second active pillars formed within the second word line, and arranged along the second word line to face the first active pillars, respectively, with the first inter-pattern insulating layer interposed therebetween.

According to an embodiment, there is provided a memory cell array. The memory cell array may include a semiconductor substrate, a first group including a first row of first active pillars arranged in a first direction at a first interval, a second row of second active pillars arranged in the first direction to correspond to the first active pillars, respectively, a first inter-pattern insulating layer interposed between the first row and the second row, a first word line extending in the first direction on one side of the first inter-pattern insulating layer to surround the first active pillars of the first row, and a second word line extending in the first direction on the other side of the first inter-pattern insulating layer to surround the second active pillars of the second row, a second group extending parallel to the first group at the first interval and including a third row of third active pillars arranged in the first direction at the first interval, a fourth row of fourth active pillars arranged in the first direction to correspond to the third active pillars, respectively, a second inter-pattern insulating layer interposed between the third row and the fourth row, a third word line extending in the first direction on one side of the second inter-pattern insulating layer to surround the third active pillars, and a fourth word line extending n the first direction on the other side of the second inter-pattern insulating layer to surround the fourth active pillars; and resistive memory structures formed on the first to fourth active pillars to be electrically coupled to the first to fourth active pillars.

According to an embodiment, there is provided a memory cell array. The memory cell array may include a semiconductor substrate, and one or more groups arranged in a first direction at a first interval on the semiconductor substrate, wherein the group includes a first row of first active pillars arranged at the first interval in a second direction perpendicular to the first direction, a second row of second active pillars arranged in the second direction to correspond to the first active pillars, respectively, an inter-pattern insulating layer interposed between the first row and the second row, a first word line extending in the second direction on one side of the inter-pattern insulating layer to surround the first active pillars, and a second word line extending in the second direction on the other side of the inter-pattern insulating layer to surround the second active pillars.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
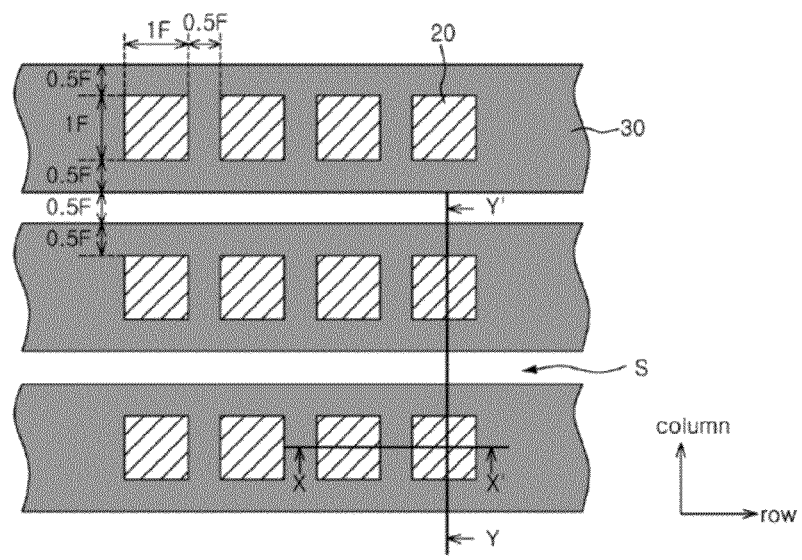
FIG. 1 is a layout diagram schematically illustrating a memory cell array structure of a general variable resistive memory device.
Figure 2:
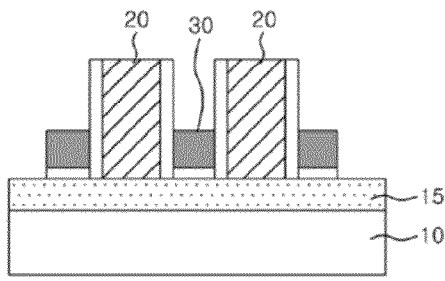
FIG. 2 is a cross-sectional view of the memory cell array taken along a line X-X' shown in FIG. 1.
Figure 3:
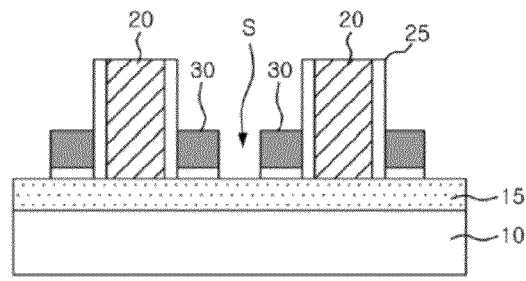
FIG. 3 is a cross-sectional view of the memory cell array taken along a line Y-Y' shown in FIG. 1.

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 4A:
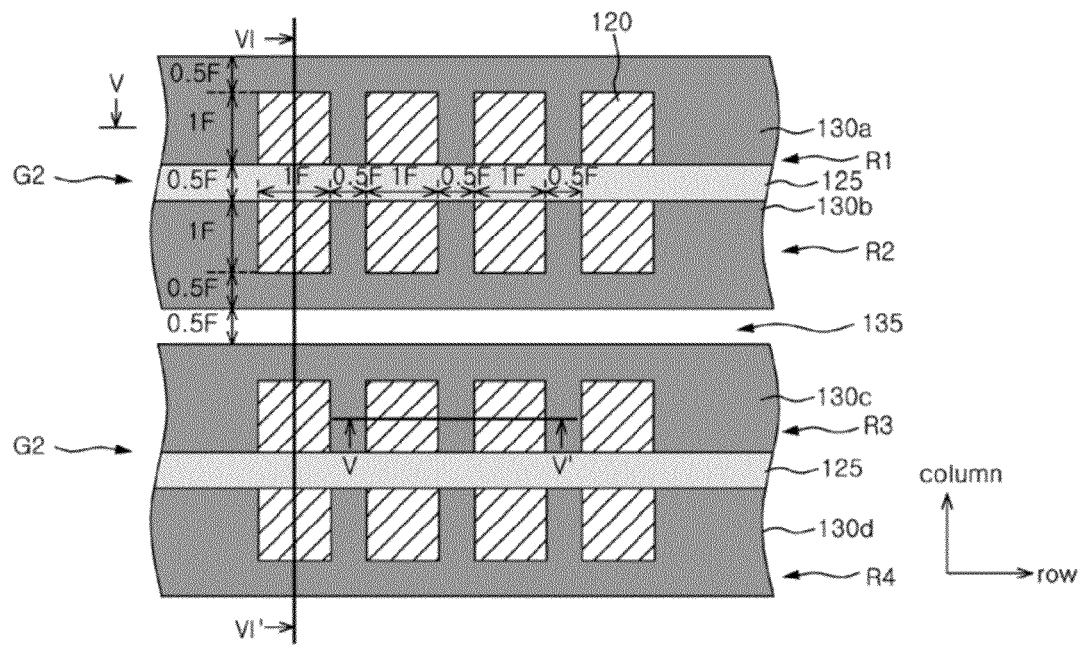
FIG. 4A is a layout diagram schematically illustrating a variable resistive memory device according to an embodiment of the inventive concept.
Figure 4B:
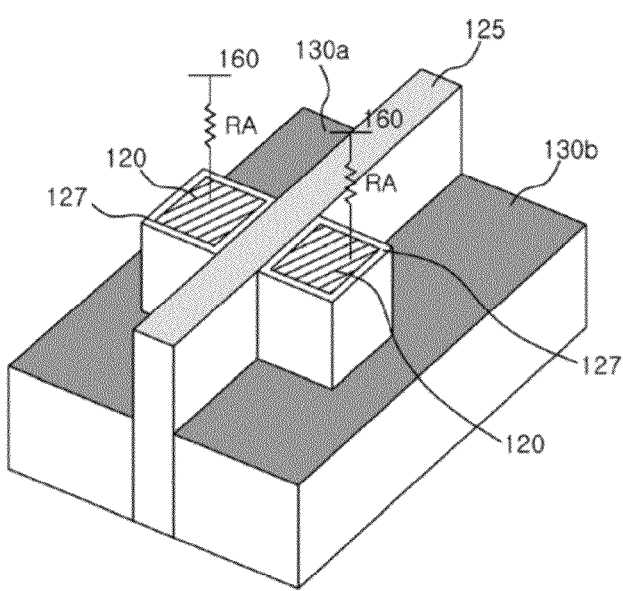
FIG. 4B is a perspective view illustrating the variable resistive memory device shown in FIG. 4A.

Referring to FIG. 4A and FIG. 4B, a memory cell array 1000 of a variable resistive memory device includes a plurality of active pillars 120 arranged in a column direction and a row direction.

Each of the plurality of active pillars 120 may protrude from an upper surface of a semiconductor substrate. For example, each active pillar 120 may have a rectangular pillar having a size of 1F by 1F. Here, F may denote a pitch size. The active pillar 120 may be a region including a channel of a transistor serving as an access device. Further, the active pillar 120 may be interpreted as a unit memory cell.

A first active pillar group G1 may include two active pillar rows R1 and R2 extending in parallel. A second active pillar group G2 may include two active pillar rows R3 and R4 extending in parallel. Active pillars 120 constituting the active pillar rows R1 to R4 may be spaced at a distance of 0.5F apart in a row direction. Further, active pillars 120 constituting the same active pillar group G1 or G2 may be spaced at a distance of 0.5F apart in a column direction. That is, an active pillar of the first active pillar row R1 and an active pillar of the second active pillar row R2, which are arranged in the same column, may be spaced at a distance of 0.5F apart. The first and second active pillar groups G1 and G2 may be spaced at a distance of 0.5F apart.

Two active pillars included in different groups G1 and G2 and adjacently arranged in the same row may be spaced from each other by a distance of 1.5F, because of a line width of a word line to be formed later.

An inter-pattern insulating layer 125 may be interposed between the active pillars 120 arranged in the two rows R1 and R2 of the same group G1 or the two rows R3 and R4 of the same group G2. The inter-pattern insulating layer 125 may substantially have the same height (thickness) as those of the active pillars 120 adjacent thereto.

Word lines 130a to 130d are formed every row R1 to R4 to surround the active pillars 120 arranged in the same row. At this time, a pair of word lines 130a and 130b included in the same group G1 and a pair of word lines 130c and 130d included in the same group G2 may be arranged to be symmetrical with the inter-pattern insulating layer 125 interposed therebetween. Therefore, the pair of word lines 130a and 130b of the two rows R1 and R2 included in the same group G1 and the pair of word lines 130c and 130d of the two word lines R3 and R4 included in the same group G2 may be insulated by the inter-pattern insulating layer 125, while the word lines 130b and 130c of two rows R2 and R3 included in the different groups G1 and G2 may be insulated from each other by an interlayer insulating layer 135.

For example, the pair of word lines 130a and 130b of the two rows R1 and R2 included in the same group G1 and the pair of word lines 130c and 130d of the two rows R3 and R4 included in the same group G2 may surround three sides of the active pillars 120. The pair of word lines 130a and 130b in the two rows R1 and R2 included in the same group G1 and the pair of word lines 130c and 130d in the two rows R3 and R4 included in the same group G2 are in contact with the inter-pattern insulating layer 125.

The word lines 130a to 130d may have line widths of 1.5F and may be arranged with a distance of 0.5F. The inter-pattern insulating layer 125 is interposed between the pair of word lines 130a and 130b included in the same group G1 and the pair of word lines 130c and 130d included in the same group G2. The pair of word lines 130a and 130b are insulated from each other by the inter-pattern insulating layer 125. The pair of word lines 130c and 130d are also insulated from each other by the inter-pattern insulating layer 125. The active pillars 120 are arranged at a contact interface between the word lines 130a to 130d and the inter-pattern insulating layer 125. One side of each of the pillars 120 is in contact with the inter-pattern insulating layer 125 and the other sides of each of the pillars 120 are surrounded by the word lines 130a to 130d.

A gate insulating layer 127 may be interposed between the word lines 130a to 130d and the active pillars 120. Further, the word lines 130a to 130d may be formed to have heights lower than those of the active pillars 120.

Figure 5:
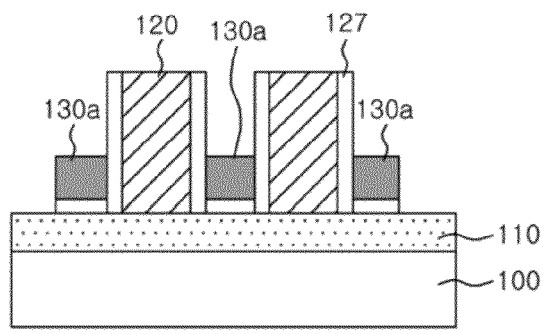
FIG. 5 is a cross-sectional view of the variable resistive memory device taken along a line V-V' shown in FIG. 4A.
Figure 6:
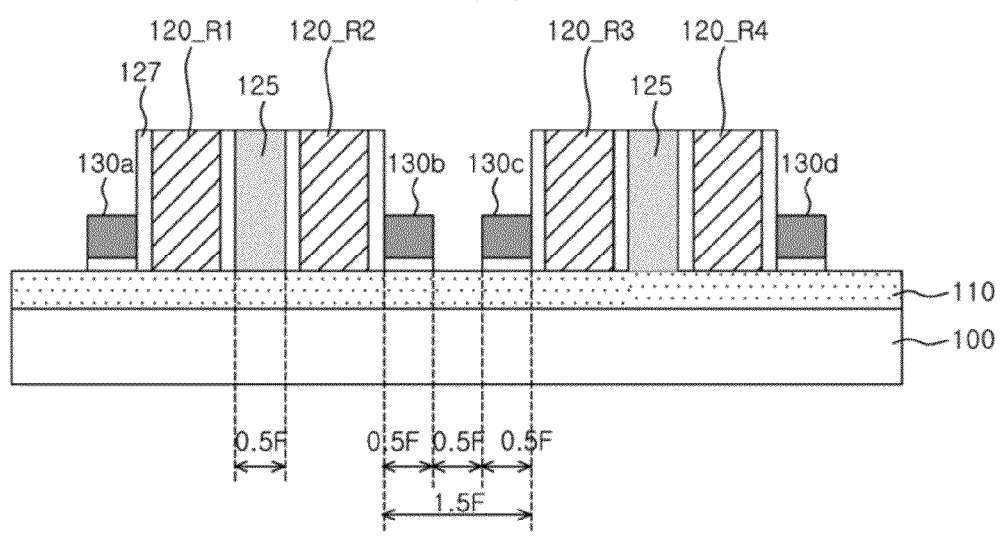
FIG. 6 is a cross-sectional view of the variable resistive memory device taken along a line VI-VI' shown in FIG. 4A.

FIG. 5 is a cross-sectional view of the memory cell array taken along a line V-V' of FIG. 4A. FIG. 6 is a cross-sectional view of the memory cell array taken along a line VI-VI' of FIG. 4A.

Referring to FIGS. 5 and 6, a common source 110 is formed on a semiconductor substrate 100. The active pillars 120 having a pattern shape are formed on the common source 110. The gate insulating layer 127 is formed on the common source 110 and surfaces of the active pillars 120. The word lines 130a to 130d are formed to surround sidewalls of the active pillars 120.

When viewed in a cross-section of FIG. 5, the word line 130a is arranged between the active pillars 120 arranged in the same row.

When viewed in a cross-section of FIG. 6, active pillars 120_R1 and 120_R2 or active pillars 120_R3 and 120_R4 in the same column included in the same group G1 or G2 are spaced from each other in the column direction on the basis of the inter-pattern insulating layer 125 having a line width of 0.5F.

The active pillar 120_R1 on the first row R1 and the active pillar 120_R2 on the second row R2 are insulated by the gate insulating layer 127 and the inter-pattern insulating layer 125. A first word line 130a is arranged on the first row R1 to surround a circumference of the active pillar 120_R1 on the first row R1, and a second word line 130b is arranged on the second row R2 to surround a circumference of the active pillar 120_R2 on the second row R2. Similarly, the active pillar 120_R3 on the third row R3 and the active pillar 120_R4 on the fourth row R4 are insulated by the gate insulating layer 127 and the inter-pattern insulating layer 125. A third word line 130c is arranged on the third row R3 to surround a circumference of the active pillar 120_R3 on the third row R3, and a fourth word line 130d is arranged on the fourth row R4 to surround a circumference of the active pillar 120_R4 on the fourth row R4. As a result, the first to fourth word lines 130a to 130d are spaced apart at 0.5F interval, and the active pillar 120_R2 on the second row R2 and the active pillar 120_R3 on the third row R3 may be spaced at a distance of 1.5F apart.

As Table below, in the memory cell array 1000 of the variable resistive memory device according to the embodiment, an arrangement of four active pillars 120 (unit memory cell A1) is $12F^2$. The area may be reduced by $3F^2$ compared with an area $15F^2$ of four unit memory cells A0 (see FIG. 1) in the related art.

TABLE

| | Area |
|---|---|
| In this embodiment | 3F*4F = $12F^2$ |
| In the related art | 3F*5F = $15F^2$ |

That is, in the surround gate structure of the present embodiment, the word lines surround some sides of the active pillars to reduce a layout area of the variable resistive memory device.

Figure 7:
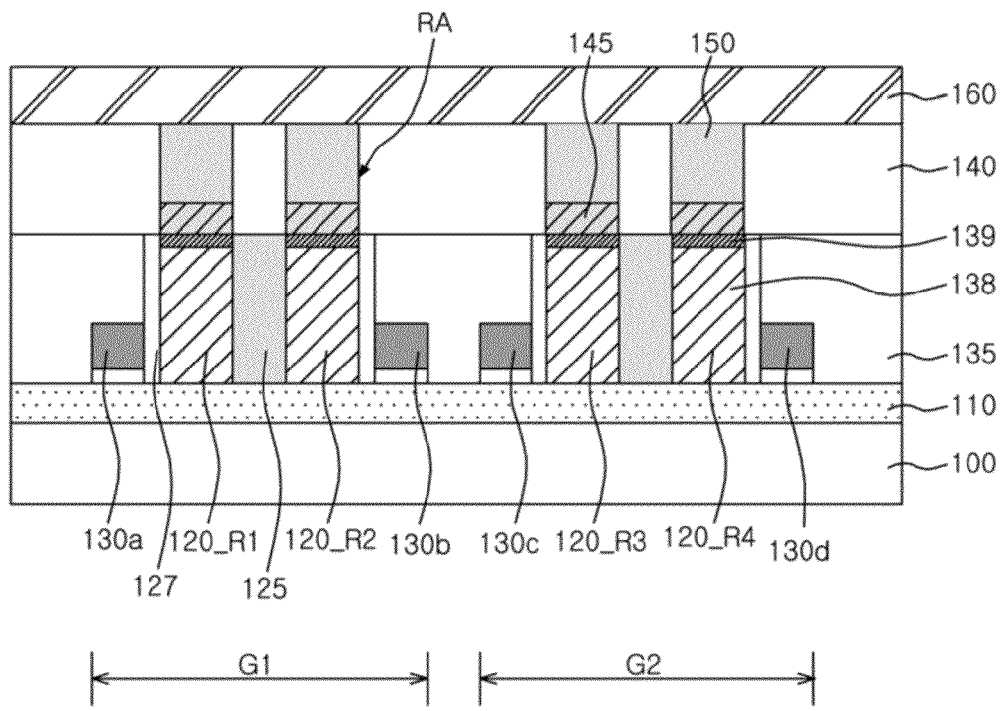
FIG. 7 is a cross-sectional view illustrating a variable resistive memory device according to another embodiment.

Referring to FIG. 7, a first interlayer insulating layer 135 is formed on a semiconductor substrate where word lines 130a to 130d are insulated from each other. The first interlayer insulating layer 135 may be etched back to expose upper surfaces of active pillars 120_R1, 120_R2, 120_R3, and 120_R4. A drain 138 is formed in an upper portion of each of the exposed active pillars 120_R1 to 120_R4. Here, a numeric reference 139 directs to an ohmic contact layer.

A second interlayer insulating layer 140 may be formed on the first interlayer insulating layer 135. The second interlayer insulating layer 140 may be etched to expose each of the drains 138 to form a variable resistive space RA.

A heating electrode 145 is formed on a lower portion of each of the variable resistive spaces RA to be electrically coupled to the drain 138. A variable resistive layer 150 is formed on the heating electrode 145 to be filled within the variable resistive space RA. The variable resistive layer 150 may include a PCMO layer as a resistive memory material, a chalcogenide layer as a phase-change memory material, a magnetic layer as a magnetic memory material, a magnetization switching device layer as a spin transfer torque memory random access memory (STTMRAM) material, or a polymer layer as a polymer memory material.

A bit line 160 is formed on the second interlayer insulating layer 140 to be coupled to the variable resistive layer 150. The bit line 160 may extend in a direction crossing the word lines 130a to 130d (for example, the column direction of FIG. 4).

Figure 8A:
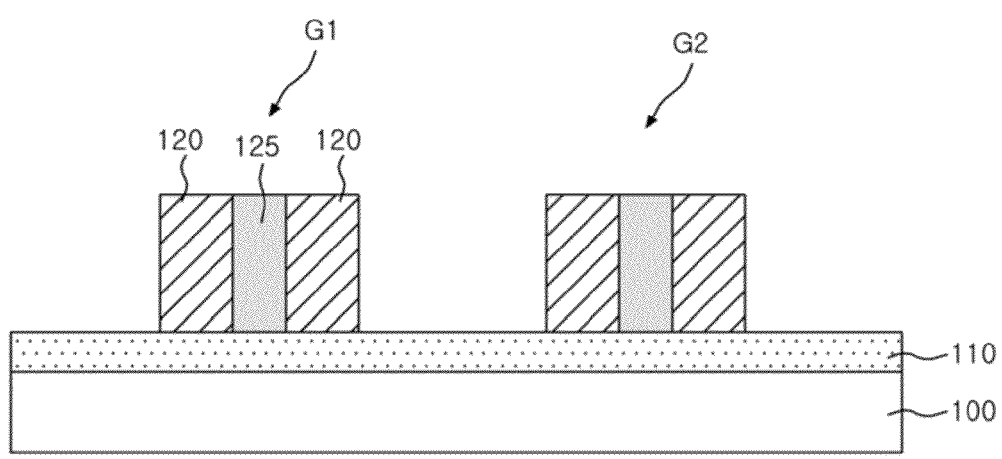
FIGS. 8A and 8B are cross-section views for processes illustrating a method of fabricating a variable resistive memory device according to an embodiment of the inventive concept.
Figure 8B:
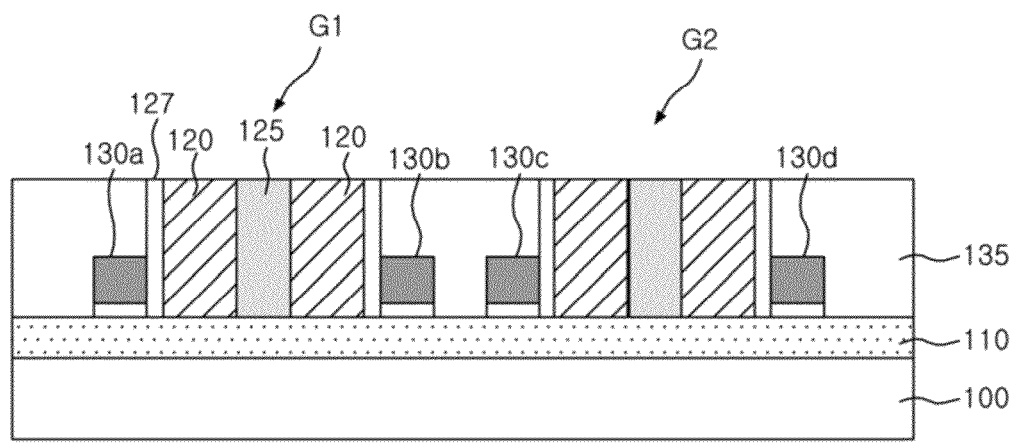

FIGS. 8A and 8B are cross-sectional views illustrating a method of fabricating a variable resistive memory cell array according to an embodiment.

Referring to FIG. 8A, a common source 110 is formed on a semiconductor substrate 100. The common source 110 may be formed for groups or columns and may be formed of a type of an Impurity region or a conductive layer.

An active layer is deposited on the semiconductor layer 100 including the common source 110 and then patterned in a predetermined pattern to define active pillars 120. The active layer may include, for example, a semiconductor layer such as polysilicon. Next, an inter-pattern insulating layer 125 is deposited to be filled within the active pillars 120 and then etched to remain between active pillars 120 included in the same group.

Referring to FIG. 8B, a gate insulating layer 127 and a conductive layer are formed along surfaces of the active pillars 120 and the common source 110 and anisotropically etched. Therefore, word lines 130a to 130d are formed to surround sidewalls of the active pillars 120. Next, a first interlayer insulating layer 135 is deposited to insulate the word lines 130a to 130d from each other and the planarized to form the memory cell array.

According to the embodiments, the inter-pattern insulating layer is interposed between the pair of word lines constituting the one group and the active pillars are arranged at intervals at a contact surface between the inter-pattern insulating layer and the word lines. Accordingly, an area can be reduced by a line width of the word line surrounding one side of the active pillar. Thus, a layout area of the cell area can be reduced.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A memory cell array, comprising:
   a semiconductor substrate;
   a first word line formed on the semiconductor substrate;
   a second word line formed on the semiconductor substrate, and extending substantially parallel to the first word line;
   a first inter-pattern insulating layer interposed between the first and second word lines;
   first active pillars formed within the first word line, and arranged along the first word line at a first interval; and
   second active pillars formed within the second word line, and arranged along the second word line to face the first active pillars, respectively, with the first inter-pattern insulating layer interposed therebetween, wherein one side of each first active pillar is in contact with one side of the first inter-pattern insulating layer and one side of each second active pillar is in contact with the other side of the first inter-pattern insulating layer.

2. The memory cell array of claim 1, wherein the first word line overlaps other sides of the first active pillars, and the second word line overlaps other sides of the second active pillars.

3. The memory cell array of claim 2, further comprising:

a gate insulating layer interposed between the first active pillars and the first word line, between the second active pillars and the second word line, and between the semiconductor substrate and the first and second word lines.

4. The memory cell array of claim 1, further comprising:

a common source region formed in a surface of the semiconductor substrate.

5. The memory cell array of claim 1, further comprising:

a third word line and a fourth word line formed on the semiconductor substrate, and extending substantially parallel to the second word line, wherein the first to fourth word lines are arranged to be spaced apart at a second interval.

6. The memory cell array of claim 5, wherein the second word line and the third word line are spaced apart at the first interval.

7. The memory cell array of claim 6, further comprising:

an interlayer insulating layer interposed between the second word line and the third word line.

8. The memory cell array of claim 5, further comprising:

a second inter-pattern insulating layer interposed between the third and fourth word lines.

9. The memory cell array of claim 8, further comprising:

third active pillars formed within the third word line, and arranged along the third word line at the first interval; and fourth active pillars formed within the fourth word line, and arranged along the second word line to face the third active pillars, respectively, with the second inter-pattern insulating layer interposed therebetween.

10. The memory cell array of claim 9, further comprising:

a gate insulating layer interposed between the third active pillars and the third word line, between the fourth active pillars and the fourth word line, and between the semiconductor substrate and the third and fourth word lines.

11. The memory cell array of claim 9, further comprising:

drain regions formed in upper regions of the first to fourth active pillars.

12. The memory cell array of claim 11, further comprising:

a heating electrode formed on the drain regions of the first to fourth active pillars;

a resistive memory layer formed on the heating electrode; and a bit line formed to be electrically coupled to the resistive memory layer.

13. A memory cell array, comprising:

a semiconductor substrate;

a first group including a first row of first active pillars arranged in a first direction at a first interval, a second row of second active pillars arranged in the first direction to correspond to the first active pillars, respectively, a first inter-pattern insulating layer interposed between the first row and the second row, a first word line extending in the first direction on one side of the first inter-pattern insulating layer to surround the first active pillars of the first row, and a second word line extending in the first direction on the other side of the first inter-pattern insulating layer to surround the second active pillars of the second row;

a second group extending parallel to the first group at the first interval and including a third row of third active pillars arranged in the first direction at the first interval, a fourth row of fourth active pillars arranged in the first direction to correspond to the third active pillars, respectively, a second inter-pattern insulating layer interposed between the third row and the fourth row, a third word line extending in the first direction on one side of the second inter-pattern insulating layer to surround the third active pillars, and a fourth word line extending in the first direction on the other side of the second inter-pattern insulating layer to surround the fourth active pillars; and resistive memory structures formed on the first to fourth active pillars to be electrically coupled to the first to fourth active pillars.

14. The memory cell array of claim 13, further comprising:

an insulating layer formed on the first group and the second group to insulate the first group and the second group.

15. The memory cell array of claim 13, further comprising:

a common source region formed between the semiconductor substrate and the active pillars of the first to fourth rows.

16. The memory cell array of claim 15, further comprising:

drain regions formed in upper regions of the active pillars of the first to fourth rows.

17. The memory cell array of claim 16, wherein each of the resistive memory structures includes:

a heating electrode formed to be electrically coupled to a corresponding drain region;

a resistive memory layer formed on the heating electrode; and a bit line formed to be electrically coupled to the resistive memory layer.

18. The memory cell array of claim 13, further comprising:

a gate insulating layer interposed between the first to fourth active pillars and the first to fourth word lines.

19. The memory cell array of claim 13, wherein the first to fourth active pillars have one pitch size, and the first interval has a 0.5 pitch size.

20. A memory cell array, comprising:

a semiconductor substrate; and one or more groups arranged in a first direction at a first interval on the semiconductor substrate, wherein the group includes:

a first row of first active pillars arranged at the first interval in a second direction perpendicular to the first direction, a second row of second active pillars arranged in the second direction to correspond to the first active pillars, respectively, an inter-pattern insulating layer interposed between the first row and the second row, a first word line extending in the second direction on one side of the inter-pattern insulating layer to surround the first active pillars, and a second word line extending in the second direction on the other side of the inter-pattern insulating layer to surround the second active pillars, wherein one side of each first active pillar is in contact with one side of the inter-pattern insulating layer and one side of each second active pillar is in contact with the other side of the inter-pattern insulating layer.

* * * * *